United States Patent [19]
Stegens

[11] 3,940,706
[45] Feb. 24, 1976

[54] MICROWAVE TRANSISTOR AMPLIFIER
[75] Inventor: Ronald E. Stegens, Brookville, Md.
[73] Assignee: Communications Satellite Corporation (Comsat), Washington, D.C.
[22] Filed: May 13, 1974
[21] Appl. No.: 469,444

[52] U.S. Cl.................... 330/21; 330/38 M; 330/53
[51] Int. Cl.² ............................................ H03F 3/04
[58] Field of Search.......... 330/21, 31, 38 M, 53, 57

[56] References Cited
UNITED STATES PATENTS
3,631,358  12/1971  Ayaki.................................. 330/53

OTHER PUBLICATIONS
O'Clock, "Microstrig Amplifiers Can Be Simple," *Electronic Design* 14, July 8, 1971, pp. 66–68.
Tucker, "Synthesis of Broadband Microwave Transistor Amplifiers," *Electronics Letters*, Aug. 12, 1971, Vol. 7, No. 16, pp. 455, 456.

*Primary Examiner*—James B. Mullins
*Attorney, Agent, or Firm*—Sughrue, Rothwell, Mion, Zinn & Macpeak

[57] ABSTRACT

A low noise, multistage microwave transistor amplifier constructed using microwave integrated circuit techniques is disclosed. The illustrated embodiment is a two-stage transistor amplifier which is the basic building block for broadband, high-gain cascades. This amplifier features an interstage network consisting of a very short transmission line which minimizes the size and frequency dependence of the amplifier. This is achieved in the satellite communications band of 3.7 to 4.2 GHz by constructing the amplifier on a suitably low dielectric constant substrate rather than the usual high dielectric constant substrates used in microwave amplifier applications.

7 Claims, 21 Drawing Figures

RALEIGH STABILITY FACTOR AND $G_{max}$ VS. FREQUENCY. NOISE FIGURE PER HP FOR "OPTION 100" (HP 35876E AT 10V, 3mA)

OPTIMUM SOURCE/LOAD IMPEDANCES COMPARED TO $S_{11}*$ AND $S_{22}*$ FOR THE HP 35876E.

( * DENOTES COMPLEX CONJUGATE )

A PARTICULAR SOURCE IMPEDANCE WHICH WOULD YIELD A CONSTANT 8 dB GAIN ACROSS 3.7 TO 4.2 GHz (HP 35876E, ONE STAGE, CONJUGATELY MATCHED OUTPUT)

CONTOURS OF CONSTANT GAIN AND NOISE FIGURE (4 GHz)

CONTOURS OF CONSTANT NOISE MEASURE, M.
(HP 35876E, OPTION 100)

SYNTHESIS OF AN INPUT MATCHING NETWORK WHICH PROVIDES THE PROPER SOURCE ADMITTANCE TO ACHIEVE MINIMUM NOISE MEASURE, M

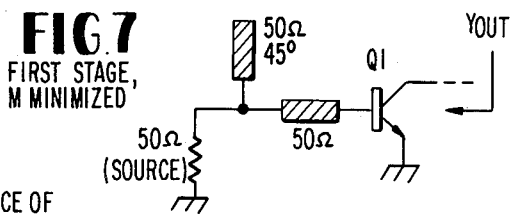
FIG. 7
FIRST STAGE, M MINIMIZED
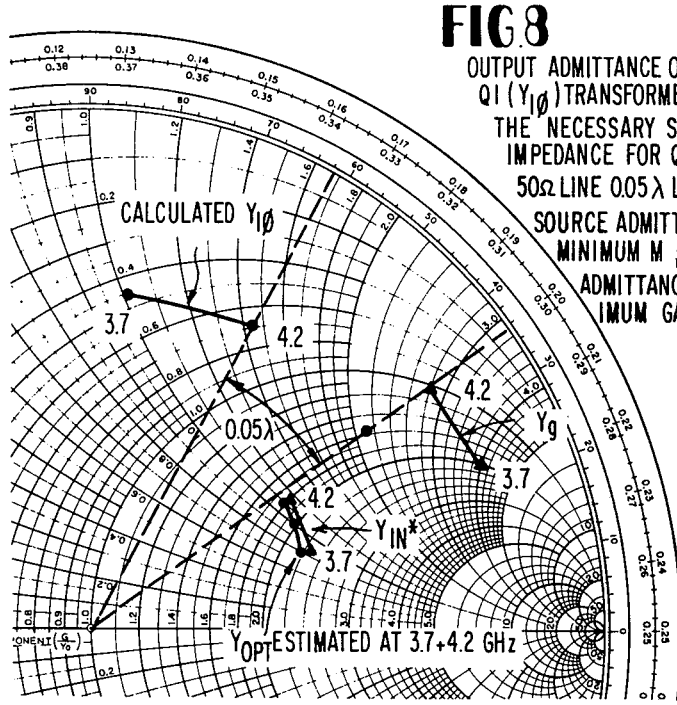
FIG. 8
OUTPUT ADMITTANCE OF Q1 ($Y_{1\phi}$) TRANSFORMED INTO THE NECESSARY SOURCE IMPEDANCE FOR $Q_2$ BY USING A 50Ω LINE 0.05λ LONG ($Y_{OPT}$ = SOURCE ADMITTANCE FOR MINIMUM M ; $Y_g$ = SOURCE ADMITTANCE FOR MAXIMUM GAIN )
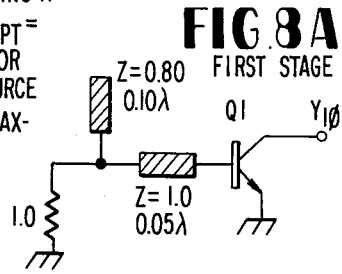
FIG. 8A
FIRST STAGE
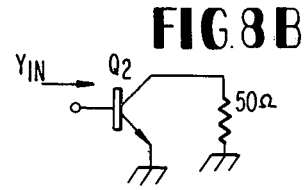
FIG. 8B
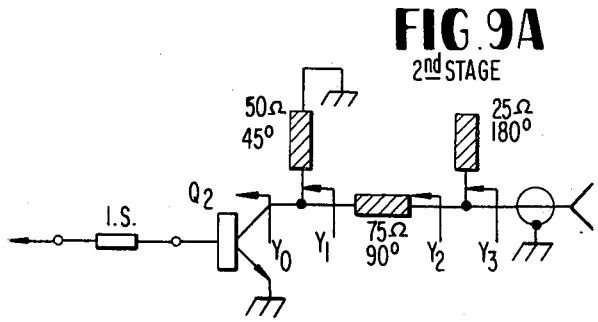
FIG. 9A
2nd STAGE
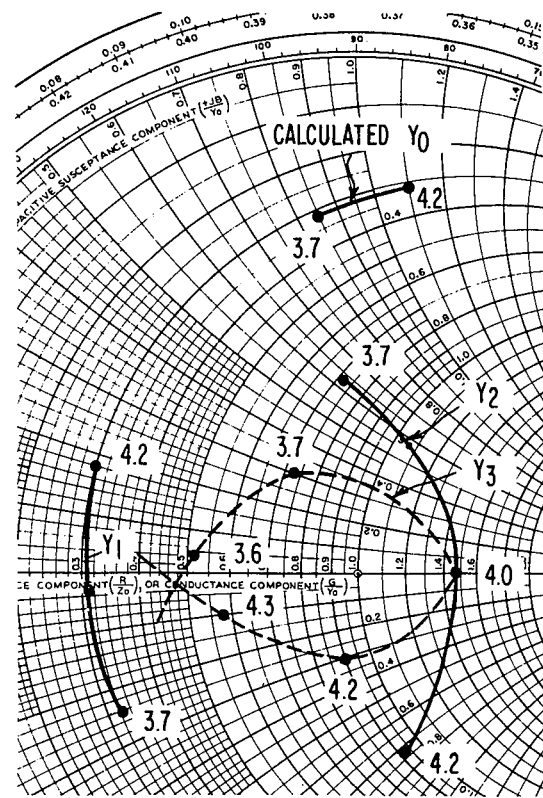
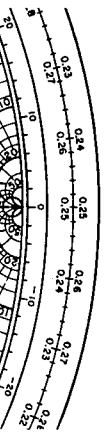
FIG. 9
SYNTHESIS OF OUTPUT MATCHING NETWORK

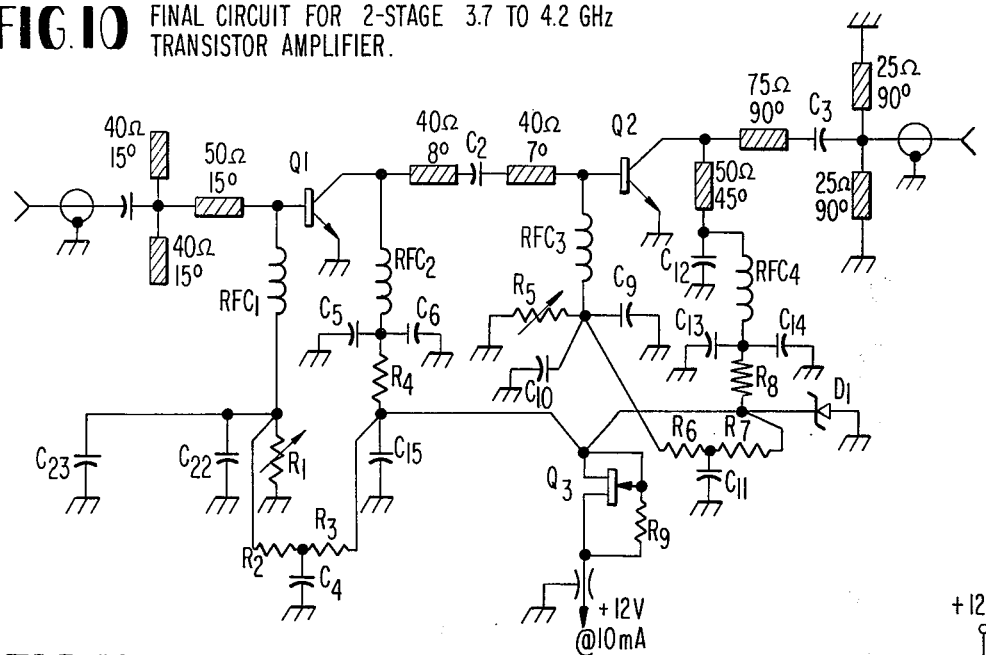
FIG.10 FINAL CIRCUIT FOR 2-STAGE 3.7 TO 4.2 GHz TRANSISTOR AMPLIFIER.
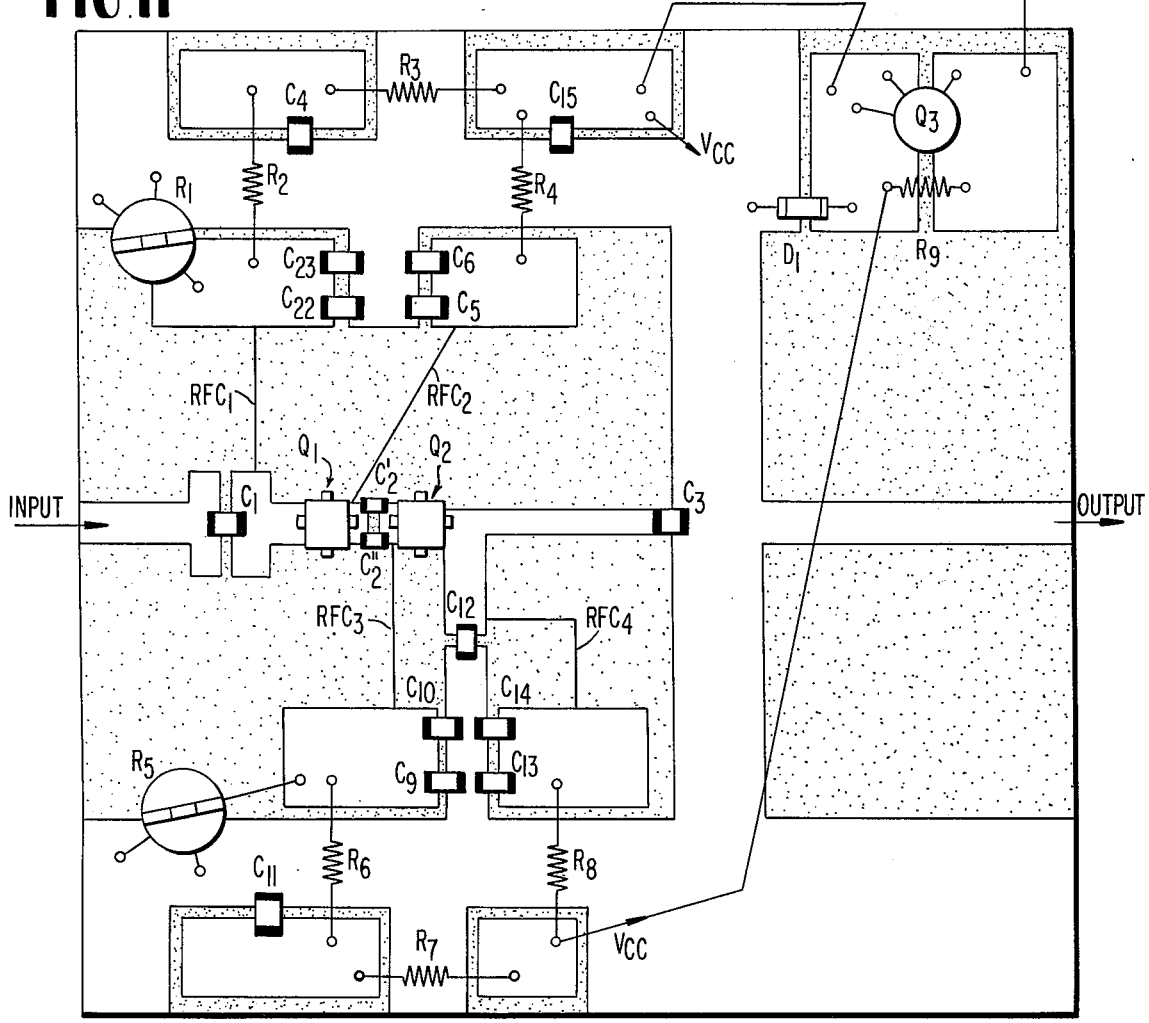
FIG.11

MEASURED GAIN AND NOISE FIGURE
OF THE 2-STAGE HP35876E AMPLIFIER
(NOTE THAT AT 15 mA, HIGHER GAIN
MORE THAN OFFSETS ANY INCREASE
IN AMPLIFIER NOISE FIGURE)

MEASURED INPUT AND
OUTPUT IMPEDANCE MATCHES

REDUCED SENSITIVITY TO SUPPLY
VOLTAGE OBTAINED USING SIMPLE
FET REGULATOR

MICROWAVE TRANSISTOR AMPLIFIER

BACKGROUND OF THE INVENTION

1. Field of the Invention

The present invention generally relates to microwave amplifiers, and more particularly to a low noise, multistage transistor amplifier constructed using microwave integrated circuit techniques.

2. Description of the Prior Art

In the past, the use of tunnel diodes in low noise microwave amplifiers resulted in certain restrictions being placed upon the system designer, the development engineer, and the microwave system itself. These restrictions resulted from the limitations of the device, namely, very low output power before the onset of serious intermodulation distortion, limited gain bandwidth product, the requirement of at least two circular junctions for each 10–12 dB of gain desired in multistage amplifiers, extreme regulation requirements of the supply voltage, moderately high noise figures, and poor reliability and stability.

In spite of the numerous drawbacks of tunnel diode amplifiers, they are often superior to three-terminal or two-port amplifiers such as transistor amplifiers in microwave applications. The limiting factor in transistor amplifiers, besides the transistors themselves, is the close impedance matching required for low noise, broadband operation in the microwave region, for example in the 3.7 to 4.2 GHz satellite communications band. Such amplifiers have typically been constrained to the use of alumina as a substrate and have required multi-element matching networks of short-circuit lines, open-circuit lines, quarter-wavelength transformers, and the like. These additional elements tend to narrow the ultimate bandwidth of the amplifier, and broadband operation can be achieved only at the expense of even more complex matching networks.

SUMMARY OF THE INVENTION

It is, therefore, an object of the present invention to provide an extremely low noise microwave transistor amplifier having a wider bandwidth and greatly increased reliability than obtainable using tunnel diode amplifiers.

It is another object of the invention to provide a multistage microwave integrated circuit transistor amplifier having a noise temperature improvement on the order of 25 percent over state-of-the-art tunnel diode amplifiers.

It is a further object of the invention to provide an optimal transistor amplifier for use in the microwave spectrum which is simple in construction and unconditionally stable.

The foregoing and other objects of the invention are attained by providing a two-stage microwave integrated circuit transistor amplifier featuring very simple impedance matching networks. These networks are made possible in part by the choice of a low dielectric constant substrate permitting the design, for example, of an interstage network consisting of a very short transmission line. Such a design is impossible when the usual choice of alumina is used for the substrate. The resulting simplicity of the matching circuits according to the invention is directly responsible for minimizing both the size and frequency dependence of the amplifier. The choice of a low dielectric constant substrate for such an application is remarkable since such substrates are "soft", and it has been generally thought that the rigidity and physical stability offered by "hard" substrates such as alumina was a prerequisite to microwave amplifier design. Typical soft substrates which may be used in the practice of the invention are polyphenylene-oxide (PPO), Teflon, Fiberglass, and the like. These have dielectric constants of about 2.5 in contrast with a dielectric constant on the order of 10 for alumina.

With the use of the soft substrates, a greater physical spacing corresponding to an electrical spacing on the order of 15° actually allows the transistors in a two-stage amplifier to be mounted electrically closer together in a realizable design; it is now possible according to the teaching of the invention to construct simplier matching networks. Not only does the basic simplicity of the design facilitate construction, the soft substrates are easier to machine permitting even square holes to be drilled to accommodate the shape of some microwave transistors.

According to the detailed disclosure of the invention hereinafter, the optimal two-stage amplifier is designed by first determining what gain/frequency performance can be expected from the transistors used, including an evaluation of potential stability problems. Noise data is determined separately through appropriate measurement. The combination of the gain and noise data leads to a solution for an optimum tradeoff, resulting in a minimum obtainable "noise measure." Finally, specified levels of gain flatness and output impedance match are obtained without degrading noise measure. Broadband, simultaneous minimization of noise measure, gain ripple, and impedance mismatch is in general only possible in amplifiers of two or more stages, so that the optimal two-stage amplifier can be considered a basic building block for high gain cascades.

BRIEF DESCRIPTION OF THE DRAWINGS

The specific nature of the invention, as well as other objects, aspects, uses and advantages thereof, will clearly appear from the following description and from the accompanying drawings, in which:

FIG. 7 is a schematic diagram of the first stage of the amplifier according to the invention having an input impedance matching network in which the noise measure has been minimized.

FIGS. 8, 8A and 8B are a Smith chart and two schematic diagrams, respectively, illustrating the output impedance of $Q_1$ transformed into the necessary source impedance for $Q_2$ by using a 50Ω line 0.05λ long.

FIGS. 9 and 9A are a Smith chart and a schematic diagram, respectively, illustrating the synthesis of the output impedance matching network.

FIG. 10 is the detailed schematic diagram of the final, optimized circuit for the two-stage 3.7 to 4.2 GHz amplifier.

FIG. 11 is a plan view of the amplifier of FIG. 10 constructed using microwave integrated circuit techniques.

DESCRIPTION OF THE PREFERRED EMBODIMENT

Figure 1:
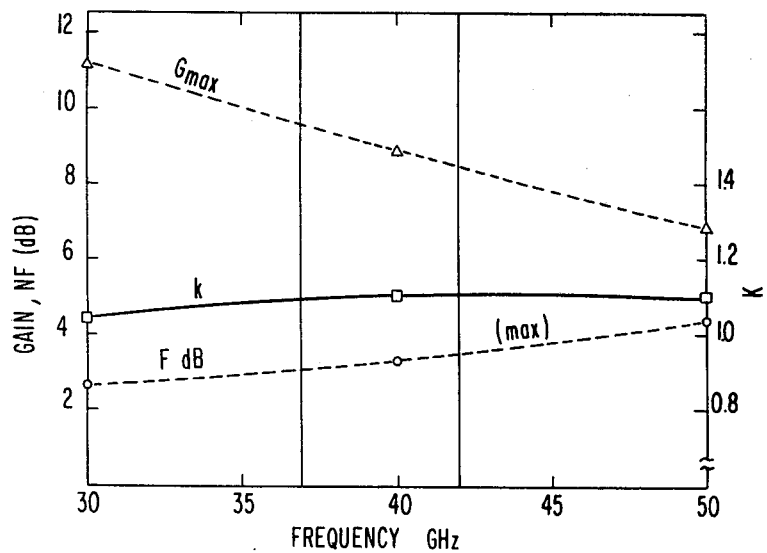
FIG. 1 is a graphical illustration of the Raleigh stability factor, $G_{max}$, and maximum noise figure vs. frequency of the transistors selected for a particular design.

In an exemplary embodiment, an NPN bipolar silicon transistor, Hewlett-Packard HP35876E, was selected for use in the amplifier, and the complete two-port performance of the device is specified by the manufacturer in the form of scattering or S-parameters over a wide frequency range. All gain and impedance data are available from the S-parameters; however, noise data must be determined independently. For the chosen device operating at the manufacturer's specified conditions of a collector voltage of 10 volts and a current of 3 milliamps for minimum noise figure, the scattering parameters are given in Table 1.

Table 1

| Parameter | 3 GHz | S Parameters 4 GHz | 5 GHz |
|---|---|---|---|
| $S_{11}$ | 0.47/173° | 0.49/155° | 0.48/135° |
| $S_{12}$ | 0.112/22° | 0.135/15° | 0.15/10° |
| $S_{21}$ | 2.0/47° | 1.45/20° | 1.20/0° |
| $S_{22}$ | 0.57/−82° | 0.58/−98° | 0.62/−112° |

Amplifier design begins from this data base. An understanding of S-parameters and their use in amplifier design and analysis may be had by reference to George E. Bodway, "Two-Port Power Flow Analysis Using Generalized Scattering Parameters," *Microwave Journal*, vol. 10, no. 6, May 1967, and W. H. Froehner, "Quick Amplifier Design with Scattering Parameters," *Electronics*, Oct. 16, 1967.

The scattering parameters of Table 1 can be converted, for convenience, to short circuit admittance parameters. For the simple 2 × 2 matrix which describes a three-terminal device, $$Y_{11} = \frac{1 + S_{22} - S_{11} - \Delta}{1 + S_{22} + S_{11} + \Delta} \quad (1a)$$

$$Y_{12} = -\frac{2S_{12}}{1 + S_{22} + S_{11} + \Delta} \quad (1b)$$

where
$\Delta = S_{11}S_{22} - S_{12}S_{21}$

Equations for $Y_{22}$ and $Y_{21}$ are derived by interchanging the indices 1 and 2 in equation (1).

The frequency-dependent Y parameters are then used to determine the maximum available gain, $G_{max}$, and the Raleigh stability factor, $k$, from $$k = \frac{2 \text{ Real }(Y_{11}) \text{ Real }(Y_{22}) - \text{Real}(Y_{12}Y_{21})}{|Y_{12}Y_{21}|} \quad (2)$$

$$G_{max} = \frac{|Y_{21}/Y_{12}|}{k + \sqrt{k^2 - 1}} \quad (3)$$

FIG. 1 shows how $k$ and $G_{max}$ vary across the frequency range 3.0 to 5.0 GHz. $F_1$ is the maximum noise figure over the same frequency range.

Since $k > 1$, one knows that the device is unconditionally stable (above about 2.8 GHz); that is, it cannot be made to oscillate for any real source and load impedances.

Observing $G_{max}$, the maximum gain/stage which can be expected across the 3.7 to 4.20-GHz band is about 8 dB. Since the first stage will be mismatched at the input in order to obtain minimum noise figure, a more realistic figure might be 7 dB or less.

Finally, the source and load admittances required to achieve $G_{max}$ and conjugate input and output impedance matches are:

$$Y_{sg} = \frac{|Y_{12}Y_{21}|(k^2 - 1)^{1/2}}{2 \text{ Real }(Y_{22})} + j\left\{\frac{Im(Y_{21}Y_{12})}{2 \text{ Real }(Y_{22})} - Im(Y_{11})\right\} \quad (4)$$

and $$Y_{Lg} = \frac{|Y_{21}Y_{12}|(k^2 - 1)^{1/2}}{2 \text{ Real }(Y_{11})} + j\left\{\frac{Im(Y_{12}Y_{21})}{2 \text{ Real }(Y_{11})} - Im(Y_{22})\right\} \quad (5)$$

Note that $Y_{Lg}$, $Y_{sg}$, and $G_{max}$ do not exist for $k < 1.0$, a case corresponding to potential instability.

Figure 2:
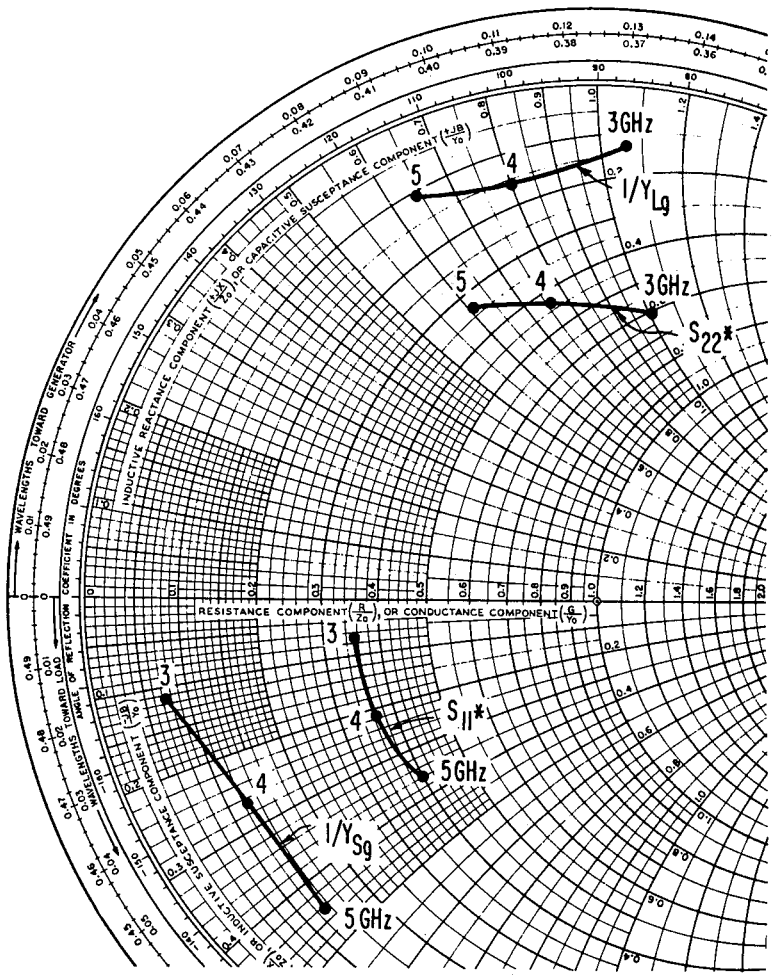
FIG. 2 is a Smith chart illustrating optimum source/load impedances compared to transistor scattering parameters $S_{11}$ and $S_{22}$.

It is of interest to plot the frequency-dependent impedances required to produce $G_{max}$ compared to the conjugates of the impedances given by $S_{11}$ and $S_{22}$. FIG. 2 makes this comparision for the HP35876E transistor. Note that the device is more difficult to match to a 50Ω system than $S_{11}$ and $S_{22}$ indicate and that equal difficulty can be expected in designing the input and output matching networks.

Whenever constant gain is required across a given frequency band (while $G_{max}$ varies, FIG. 1), it is necessary to determine constant gain circles for source and load admittances other than $Y_{sg}$ and $Y_{Lg}$.

H. Fukui has shown in an article entitled "Available Power Gain, Noise Figure, and Noise Measure of Two-Ports and Their Graphical Representations," *IEEE Transactions on Circuit Theory*, vol. CT-13, no. 2, June 1966, that constant gain circles in the rectangular $Y_s$ (source admittance) plane may be determined using the gain resistance parameter $$R_{eg} = \frac{\text{Real }(Y_{22})}{|Y_{21}|^2} \quad (6)$$

to form equation (7)

$$\frac{1}{G} = \frac{1}{G_{max}} + \frac{R_{eg}}{G_s}[(G_s - G_{sg})^2 + (B_s - B_{sg})^2] \quad (7)$$

where $Y_s = G_s + jB_s$ = source admittance
$Y_{su} = G_{su} + jB_{su}$ and $G < G_{max}$. By placing equation (8) in the form $$G_{RG}^2 = (G_s - G_G)^2 + (B_s - B_G)^2 \qquad (8)$$

one finds that constant gain contours are circles in the $Y_s$-plane, defined by their centers at $$B_G = B_{su} \qquad (9)$$

$$G_G = G_{su} + \frac{1}{2R_{eu}}\left(\frac{1}{G} - \frac{1}{G_{max}}\right) \qquad (10)$$

and radii of $$G_{RG} = \left[\frac{G_{su}}{R_{eu}}\left(\frac{1}{G} - \frac{1}{G_{max}}\right) + \frac{1}{4R_{eu}^2}\left(\frac{1}{G} - \frac{1}{G_{max}}\right)^2\right]^{1/2} \qquad (11)$$

Circles in the rectangular $Y_s$-plane can be shown to map into circles in the (Smith chart) $\rho_s$-plane. The locus of centers no longer lies on identical values of admittance, and the radii are, as expected, different. All admittance values defining the periphery of the circles are preserved in mapping the circles from the $Y_s$-plane to the $\rho_s$-plane, however. Applying the bilineal transformation $$\rho_s = |\rho|/\theta = \frac{1 - Y_s}{1 + Y_s} \qquad (12)$$

results in new circles on the Smith chart defined by centers at $$\theta_g = \tan^{-1}\left[\frac{-2b_{sg}}{1 - g_{sg}^2 - b_{sg}^2}\right] \qquad (13)$$

$$|\rho_G| = \frac{[(1 - g_{sg}^2 - b_{sg}^2)^2 + 4b_{sg}^2]^{1/2}}{(1 + g_{sg})^2 + b_{sg}^2 + 2\delta_g} \qquad (14)$$

where $$\delta_g = \frac{1}{2r_{eg}}\left(\frac{1}{G} - \frac{1}{G_{max}}\right) \qquad (15)$$

and $$b_{sg} = \frac{B_{sg}}{Y\phi} \qquad (16a)$$

$$g_{sg} = \frac{G_{sg}}{Y\phi} \qquad (16b)$$

$$r_{eg} = \frac{R_{eg}}{Z\phi} \qquad (16c)$$

The radius of the circle is $r_g$, given by $$r_g = \frac{2g_{rg}}{(1 + g_{sg})^2 + b_{sg}^2 + 2\delta_g} \qquad (17)$$

where $g_{rg} = G_{RG}/Y\phi$. Equations (13), (14), and (17) define an infinite set of circles whose centers, it should be noted, all lie on the same radial line defined by $\frac{1}{4} = \frac{1}{4}_g$.

Constant gain locii in the $\bar{Y}_L$-plane can easily be determined by substituting $Y_{Lg}$ for $Y_{sg}$, $Y_{12}$ for $Y_{21}$, and $Y_{11}$ for $Y_{22}$.

Figure 3:
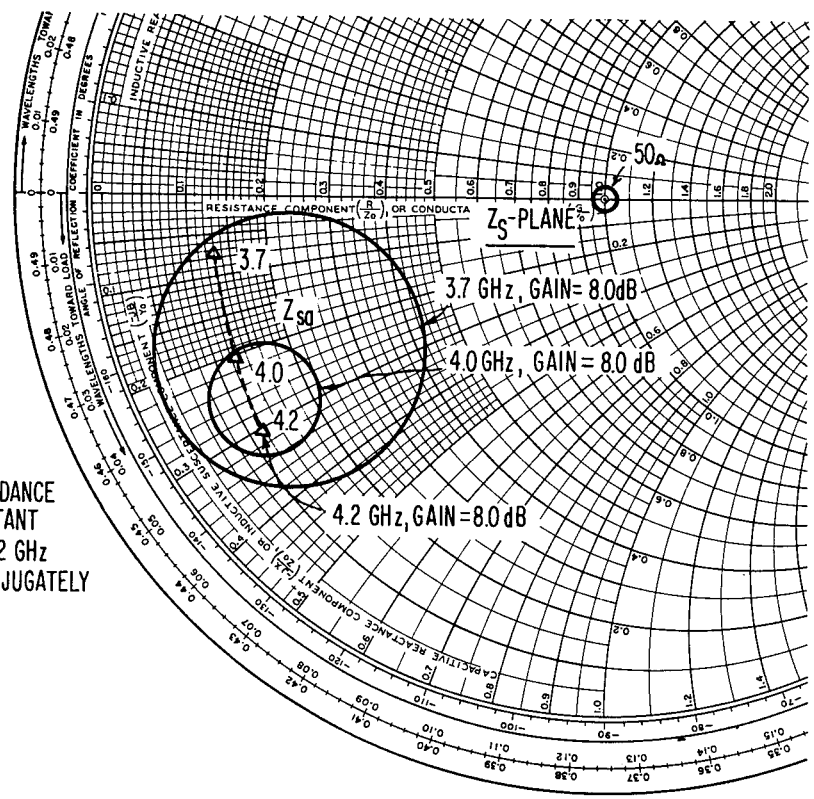
FIG. 3 is a Smith chart illustrating a paricular source impedance which would yield a constant gain across the satellite communications band of 3.7 to 4.2 GHz.

As an example of their use, FIG. 3 shows constant gain circles for the input ($Z_s$) plane of the HP35876E transistor. Impedance $Z_{sa}$ is one possible source impedance which results in a constant gain across 3.7 to 4.2 GHz. Since the gain circles represent constant available gain, the output is assumed to be conjugately matched at all frequencies.

The solution of FIG. 3 must be modified, however, in order to minimize noise figure. Thus, the contours of constant gain are useful only when combined with constant noise figure contours.

The noise figure of any two-port network is sensitive to both load and source impedances in the same way that available gain is; circles of constant noise figure exist in both the $Y_s$- and $Y_L$-planes.

H. Fukui has shown in his above-referenced article that any two-port can be completely described in terms of its noise performance by the four constants of equation (18):

$$F = F_{min} + \frac{R_{ef}}{G_s}\{(G_s - G_{sf})^2 + (B_s - B_{sf})^2\} \qquad (18)$$

where $F_{min}$ = minimum obtainable noise figure
$Y_{sf} = G_{sf} + jB_{sf}$ = that source admittance for which $F_{min}$ is obtained
$R_{ef}$ = the "noise resistance"

and all four constants may be determined experimentally. By comparing equation (17) with equation (7) an immediate solution for constant "F" circles in the $Y_s$-plane can be determined. In the rectangular $Y_s$-plane, the circles are given by their centers at $$G_F = G_{sf} + \frac{1}{2R_{ef}}(F - F_{min}) \qquad (19)$$

$$B_F = B_{sf} \qquad (20)$$

and radii of $$G_{RF} = \left[\frac{G_{sf}}{R_{ef}}(F - F_{min}) + \frac{1}{4R_{ef}^2}(F - F_{min})^2\right]^{1/2} \qquad (21)$$

Transformation of the $Y_s$-plane constant-F circles onto the $\rho_s$-plane again results in a family of circles whose centers lie on a fixed radial line.

Since no single choice of input admittance will minimize noise figure and maximize gain simultaneously, it is necessary to compromise. One criterion for excellence which may be used is the minimization of the noise measure, $M$, given by $$M = \frac{F - 1}{1 - \left(\frac{1}{G}\right)} \qquad (22)$$

where $F$ = noise figure and $G$ = gain, which is equivalent to the noise figure of an infinite chain of identical amplifiers, minus 1.0. The $F$ and $G$ of the above equation are obtained simultaneously, using a particular source admittance.

In order to solve for $F_{min}$, $M_{min}$, and contours of both, it is necessary to determine the unknowns of equation (18).

One technique is to measure the noise figure resulting from the application of at least four different source admittances and fit the results to equation (18). Often seven or more values of $Y_s$ are used, with a "best fit" result chosen.

A second technique is to adjust $Y_s$ for minimum noise figure, thus determining $Y_{sf}$ and $F_{min}$ directly. One additional data point ($Y_s/Y_\phi = 1.0 + j0$ is convenient) is then sufficient to determine $R_{ef}$. For the HP35876E at 4 GHz, the observed data were as follows:

| Measured $Z_s/Z_\phi$ | Measured Noise Figure |
|---|---|
| 1.0 + j0 | 4.0 dB |
| 0.42 − 0.20j | 3.2 dB ($F_{min}$) | which result in noise parameters of $$\frac{Y_{sf}}{Y_\phi} = 2.0 + j0.9$$

$R_{ef} = 12.3\Omega$
$F_{min} = 3.20$ dB

These data allow the designer to synthesize a network which minimizes M and thus the overall noise figure of a multistage amplifier.

The first step in low-noise amplifier design is the synthesis of an input matching network which minimizes M, thus representing an optimum compromise between high gain and low noise figure.

Figure 4:
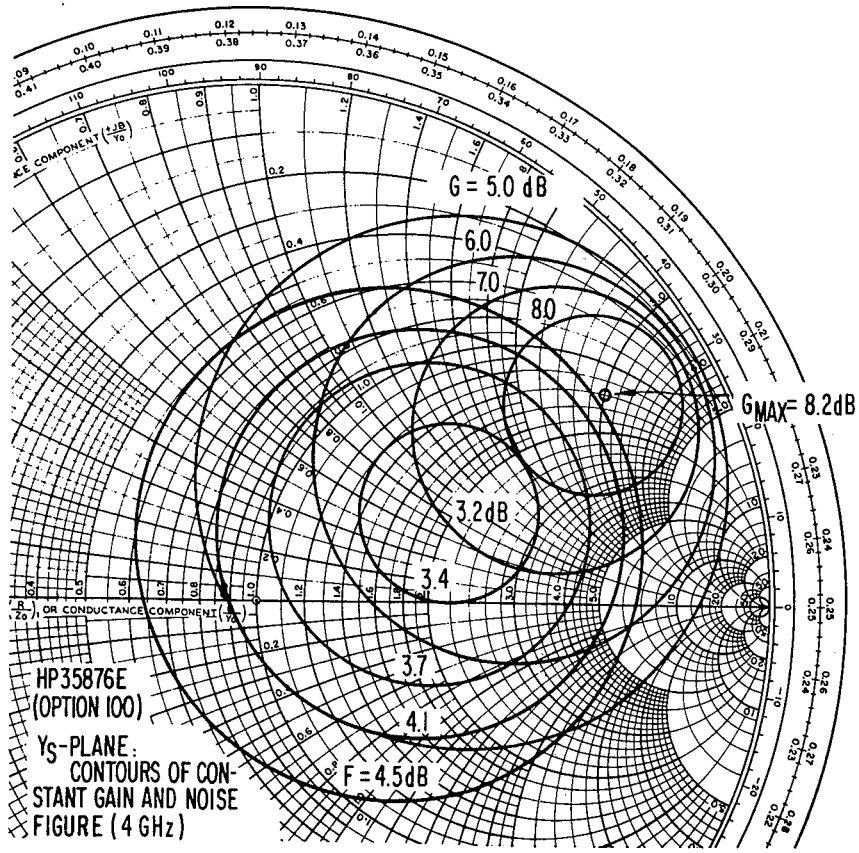
FIG. 4 is a Smith chart illustrating contours of constant gain and noise figure at 4 GHz.

FIG. 4 shows constant gain and noise figure circles (plotted on a Smith chart) for the HP35876E transistor at 4 GHz. The gain vs. noise figure tradeoff is clear.

Figure 5:
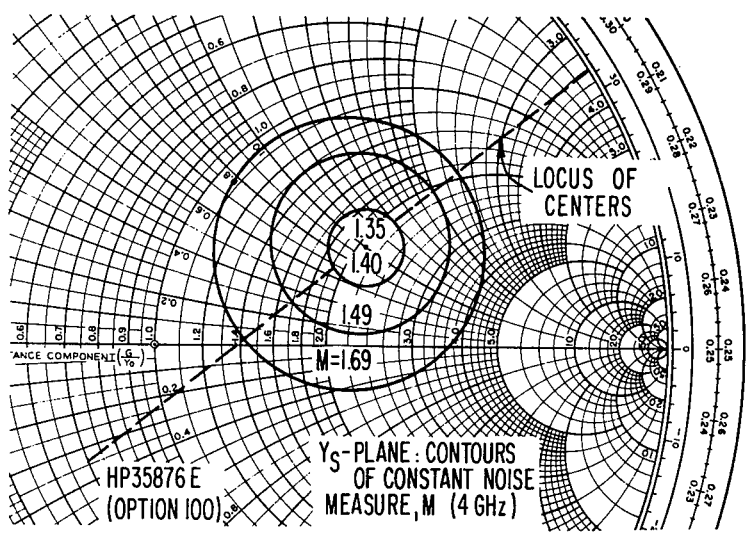
FIG. 5 is a Smith chart illustrating contours of constant noise measure at 4 GHz.

From the measured noise data, the minimum value of M is found to be
$M_{min} = 1.347$
which corresponds to an "infinite chain" noise figure of 2.347, or 3.71 dB. $M_{min}$ occurs at a calculated admittance of $$\frac{Y_{sm}}{Y_\phi} = 2.05 + 1.09j$$

and an associated gain of 7.3 dB (from FIG. 4). FIG. 5 presents these data on a Smith chart, along with constant-M circles derived mathematically.

Figure 6:
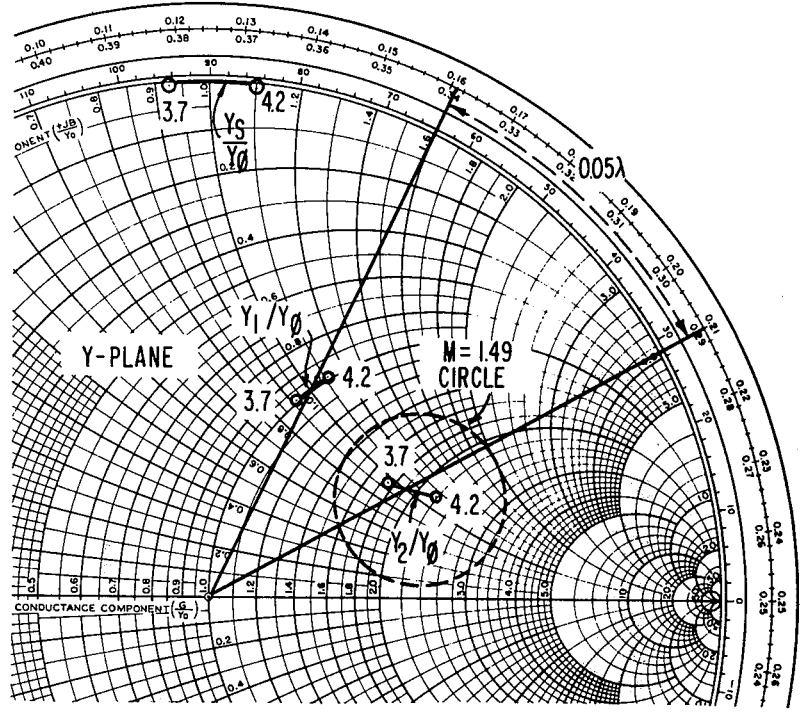
FIGS. 6 and 6A are a Smith chart and a schematic diagram, respectively, illustrating the synthesis of an input matching network which provides the proper source admittance to achieve minimum noise measure.

Finally, FIG. 6 shows how a very simple network can be synthesized to provide the proper source admittance over a wide bandwidth. While only the 4-GHz constant-M circle is used here, the resultant error is small. Likewise, more complicated networks could be synthesized either mathematically or using the Smith chart directly, but the improvement would be small or non-existent due to increased line losses.

Figure 6A:
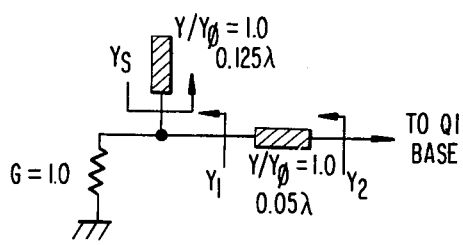

Given the network of FIG. 6a, the first-stage noise measure is minimized and the output impedance is known. Design of the interstage network connecting the output of the first stage to the input of the second is then possible.

The output admittance of the first stage (FIG. 7) is next calculated as a function of frequency. Superimposing these data on a Smith chart showing M for the source admittance plane of $Q_2$, the problem becomes clear. FIG. 8 shows these data as well as one possible interstage network determined through normal Smith chart techniques.

One is not, however, free to minimize M of $Q_2$ across the 3.7 to 4.2-GHz band. The expected gain slope (of about 1.7 dB) must be compensated for in the interstage network, since the output of $Q_2$ must be conjugately matched to the load. Referring to FIG. 4, it is clear that shortening the transmission line connecting $Q_1$ and $Q_2$ will have the desired effect of reducing the gain at 3.7 GHz.

FIGS. 8, 8A and 8B show that selection of a 0.05λ transmission line (50Ω) results in approximately the proper gain taper from 3.7 to 4.2 GHz, since gain will be highest at 4.2 GHz. The rate of slope can be altered by varying the line impedance or lengths. Second-stage noise figure should be about 3.5 dB using this interstage network.

By choosing an interstage network consisting of a very short transmission line, size and frequency dependence of the amplifier are minimized. However, a suitable low-K dielectric substrate will be seen to be necessary, rather than the more usual high-K types (e.g., alumina).

Having chosen input and output matching networks, the output impedance of $Q_2$ can be calculated directly. Again using standard Smith chart techniques, a distributed network can be synthesized to match this impedance to 50Ω over 3.7 to 4.2 GHz. FIGS. 9 and 9A show how this procedure is carried out. A 1.5:1 maximum VSWR results.

The final amplifier is pictured schematically in FIG. 10. The unwieldly portions of the optimized circuits are replaced by equivalents which are easier to realize on a microwave integrated circuit format. For example, the 25Ω, 180° open stub in the output network shown in FIG. 9A is replaced by two 25Ω, 90° shorted stubs. Thus, as shown in FIG. 10, the input impedance matching network comprises a distributed parameter network including two 40Ω, 15° open stubs followed by a short 50Ω, 15° transmission line connected to the base of $Q_1$. The interstage network coupling the collector of $Q_1$ to the base of $Q_2$ comprises a short 40Ω, 15° transmission line shown in FIG. 10 as split into two short transmission lines of 8° and 7°, respectively. Finally, the output impedance matching network comprises a 50Ω, 45° shorted stub connected to the collector of $Q_2$ followed by the 75Ω, 90° transmission lines and the previously mentioned two 25Ω, 90° shorted stubs.

Bias is introduced into the amplifier by using high-impedance, 90° transmission lines $RFC_1$ to $RFC_4$ which are thoroughly bypassed at the bias input end. These transmission lines are typically 0.003 inch wide, and by selecting a substrate of $K = 2.55$, the impedance of these lines is greater than 200Ω, making them quite invisible near 4 GHz. This low-K substrate also allowed the realization of the 15° interstage line, the actual length of which is 0.086 inch, as compared with about 0.040 inch if alumina had been used. The capacitors $C_1$, $C_2$ and $C_3$ are coupling capacitors of 100 pF providing DC isolation of the bias voltages for $Q_1$ and $Q_2$.

The series connected field effect transistor $Q_3$ in the positive DC line ensures that overvoltage will not result in damage, and reduces temperature dependence. $Q_3$ acts as a constant current source. The zener diode $D_1$ ensures that reverse voltage will not damage the microwave transistors and provides further overvoltage protection.

The amplifier as constructed on a 2 × 2 × 0.030 inch PPO substrate is shown in FIG. 11. This substrate material in a 0.030 inch thickness exhibits low radiation losses and very low dissipative losses due to the large width required for normal line impedances. The same reference numerals are used in both FIGS. 10 and 11 so that a direct comparison can be made between the schematic diagram and the physical realization of the circuit.

Figure 12A:
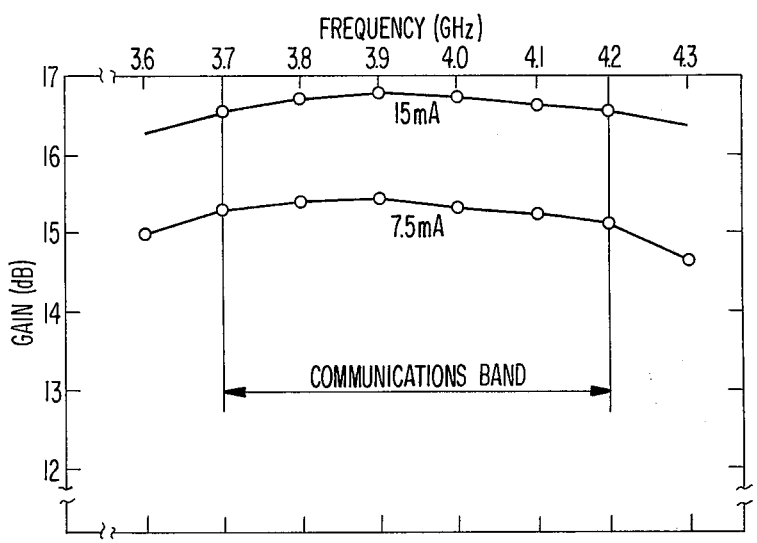
FIGS. 12A and 12B are graphs illustrating the measured gain and noise figure, respectively, of the two stage amplifier shown in FIGS. 10 and 11.
Figure 12B:
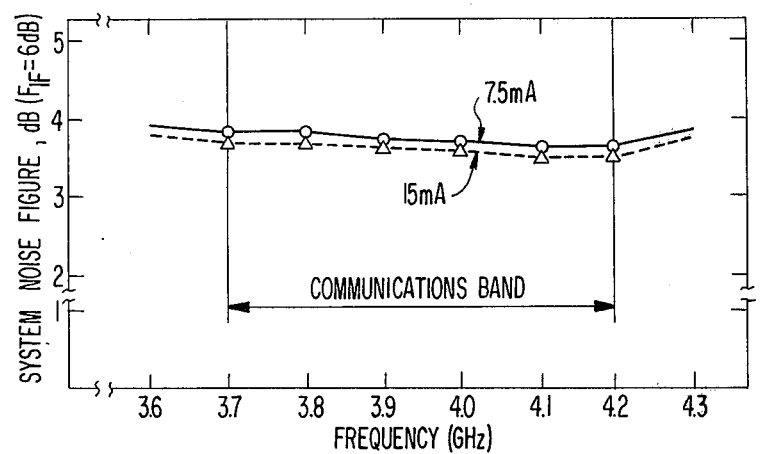

FIGS. 12A and 12B show measured noise figure, including the contribution of the measurement system ($F_{IF}$ = 6dB), and gain-frequency performance, respectively. Without an input circulator, the maximum system noise figure was 3.8 dB, corresponding to a 3.6-dB maximum amplifier noise figure. Gain was flat to within 0.2 dB.

Figure 13:
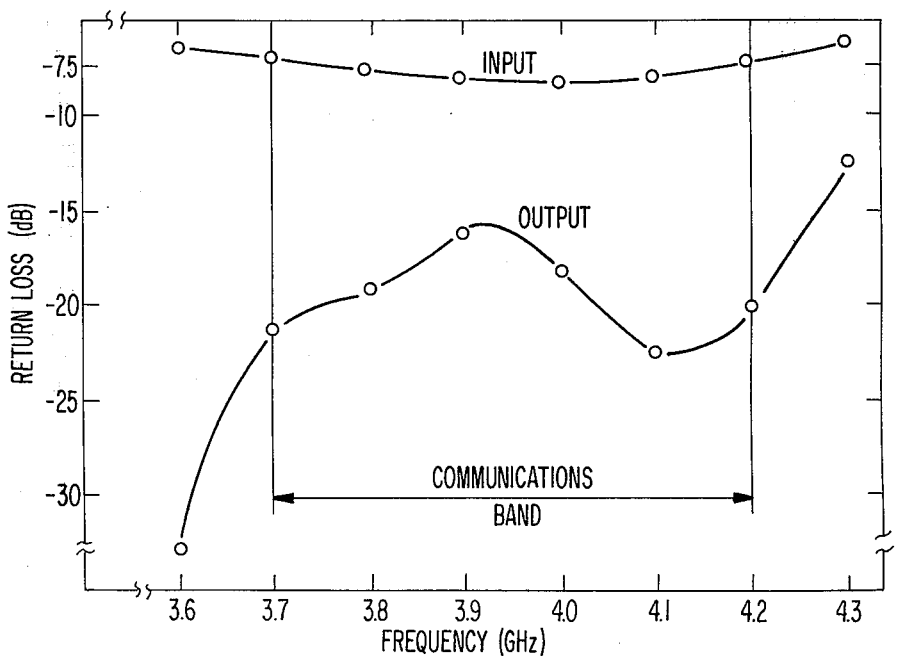
FIG. 13 is a graph illustrating the measured input and output impedance matches of the amplifier shown in FIGS. 10 and 11.

Return loss at the input and output ports is shown in FIG. 13. The output return loss was later reduced to 18 dB minimum. Input match was as expected. A single-junction circulator would be required at the input in applications requiring a low input VSWR. This could be expected to raise the overall noise figure to 3.9 dB maximum, or 4.2 dB maximum if a microwave integrated circuit circulator were used.

Figure 14A:
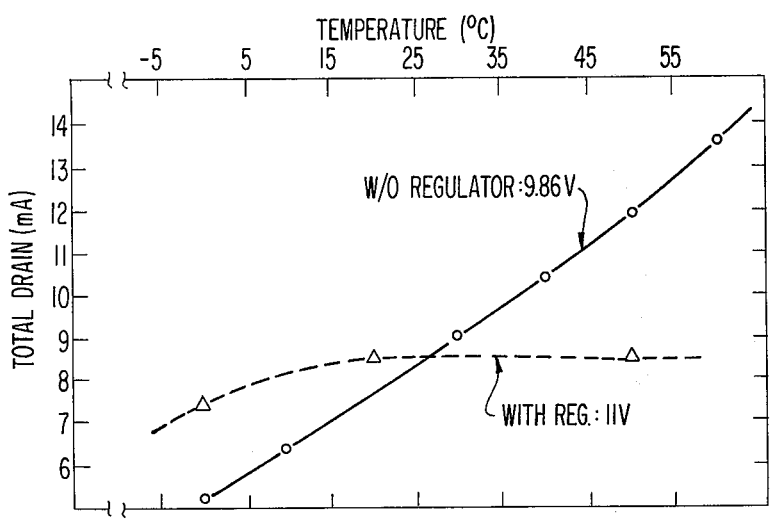
FIGS. 14A and 14B are graphs illustrating total power drain and gain, respectively, as a function of temperature both with and without the field effect transistor bias regulator shown in the circuit of FIG. 10.
Figure 14B:
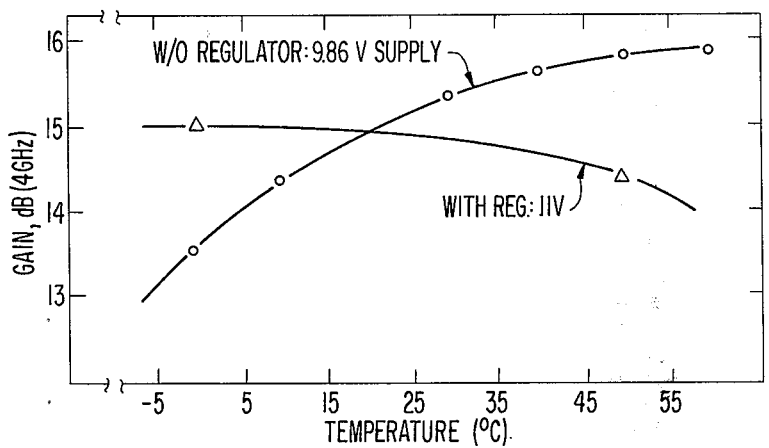
Figure 15:
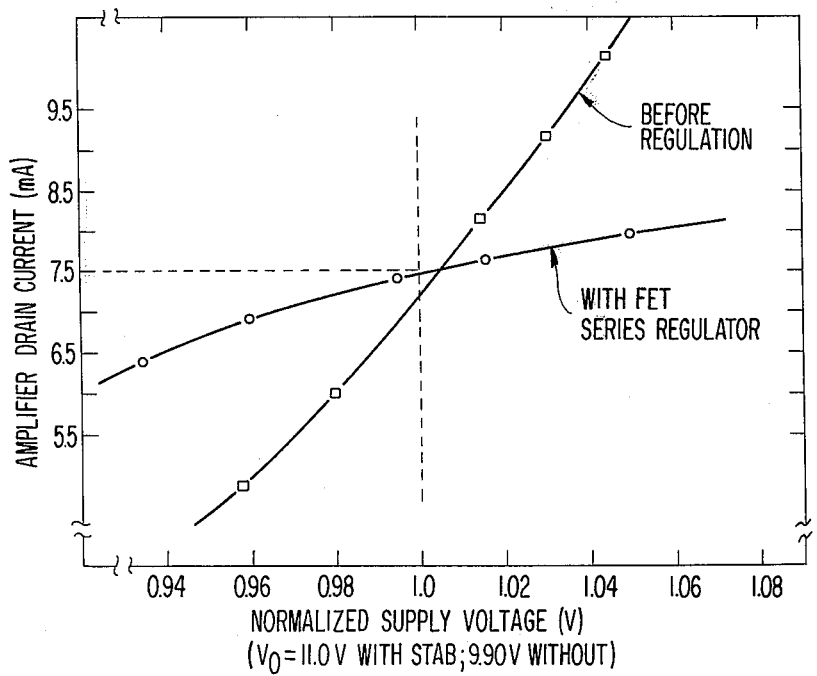
FIG. 15 is a graph illustrating the reduced sensitivity to supply voltage obtained using the field effect transistor regulator.

Temperature stability is shown in FIGS. 14A and 14B; the series field effect transistor regulator is clearly quite effective. Improvement in voltage/current sensitivity is also demonstrated in FIG. 15.

The electrical performance of the two-stage amplifier at 3.7-4.2 GHz is superior to that of any low noise amplifier currently available, excluding parametric amplifiers or cryogenic amplifiers.

Compared to state-of-the-art tunnel diode amplifiers, with which such transistor amplifiers compete directly, this device provides a noise temperature improvement of at least 25 percent, an output power 15-20 dB larger (for equivalent intermodulation), a much greater tolerance to supply voltage fluctuation, wider bandwidth, a requirement for only one circulator junction regardless of gain, unconditional stability, and greatly increased reliability.

It will be apparent, however, that the embodiment shown and described is only exemplary and that various modifications can be made in construction and arrangement within the scope of the invention as defined in the appended claims.

What is claimed is:

1. A broadband, low noise microwave transistor amplifier comprising:
    a first bipolar transistor connected as a first common emitter amplifier stage,
    an input distributed parameter impedance matching network connected to the base of said first transistor and having a source admittance selected to minimize the noise measure, $M$, of said first transistor defined by the equation $$M = \frac{F - 1}{1 - \left(\frac{1}{G}\right)}$$

where $F$ is the noise figure and $G$ is the gain,
    a second bipolar transistor connected as a second common emitter amplifier stage,
    an interstage distributed parameter impedance matching network connected to the base of said second transistor and producing a second stage source admittance selected to minimize the noise measure, $M$, of said second transistor over at least a part of the amplifier bandwidth while yielding a net constant gain for the composite two stage amplifier,
    said interstage network connecting the collector of said first transistor to the base of said second transistor and consisting of a short transmission line, and
    an output matching network connected to the collector of said second transistor which produces a constant output impedance over a broad frequency range.

2. A broadband, low noise microwave transistor amplifier as recited in claim 1 for operation in the band 3.7 to 4.2 GHz wherein said transmission line interstage network is 15 electrical degrees in length at 4 GHz.

3. A broadband, low noise microwave transistor amplifier as recited in claim 2 wherein said amplifier is constructed using microwave integrated circuit techniques on a substrate having a dielectric constant on the order of 2.5.

4. A broadband, low noise microwave transistor amplifier as recited in claim 3 wherein said transmission line interstage network is between 0.080 and 0.090 inch in length.

5. A broadband, low noise microwave transistor amplifier as recited in claim 2 wherein said input network comprises
    a pair of open circuit stubs 15 electrical degrees in length, and
    a transmission line 15 electrical degrees in length connecting said pair of open circuit stubs to the base of said first transistor.

6. A broadband, low noise microwave transistor amplifier as recited in claim 5 wherein said output network comprises
    a shorted stub 45 electrical degrees in length and connected to the collector of said second transistor,
    a pair of shorted stubs 90 electrical degrees in length, and
    a transmission line 90 electrical degrees in length connecting said shorted stub to said pair of shorted stubs.

7. A broadband, low noise microwave transistor amplifier as recited in claim 6 wherein said amplifier is constructed using microwave integrated circuit techniques on a substrate having a dielectric constant on the order of 2.5.

* * * * *

UNITED STATES PATENT AND TRADEMARK OFFICE
CERTIFICATE OF CORRECTION

PATENT NO. : 3,940,706
DATED : February 24, 1976
INVENTOR(S) : Ronald E. STEGENS It is certified that error appears in the above-identified patent and that said Letters Patent are hereby corrected as shown below:

Col. 2, Line 4, insert quotes around the word "soft".

Line 10, insert quotes around the word "soft".

Line 17, insert quotes around the word "soft".

Col. 3, Line 40, in Table 1, insert underscoring under the degrees.

Col. 5, Lines 67-68, delete "$\theta = \theta_g$", and insert --$\theta = \theta_g$--.

Col. 4, Line 55, delete "on$_C$ircuit", and insert --on Circuit--.

Signed and Sealed this

Twelfth Day of April 1977

[SEAL]

*Attest:*

RUTH C. MASON
*Attesting Officer*

C. MARSHALL DANN
*Commissioner of Patents and Trademarks*